United States Patent [19]

Kulesza et al.

[11] Patent Number: 5,237,130
[45] Date of Patent: Aug. 17, 1993

[54] FLIP CHIP TECHNOLOGY USING ELECTRICALLY CONDUCTIVE POLYMERS AND DIELECTRICS

[75] Inventors: Frank W. Kulesza, Winchester, Mass.; Richard H. Estes, Pelham, N.H.

[73] Assignee: Epoxy Technology, Inc., Billerica, Mass.

[21] Appl. No.: 810,513

[22] Filed: Dec. 19, 1991

Related U.S. Application Data

[62] Division of Ser. No. 452,191, Dec. 18, 1989, Pat. No. 5,074,947.

[51] Int. Cl.$^5$ ............................................. H05K 1/00
[52] U.S. Cl. ..................................... 174/260; 174/259; 29/830
[58] Field of Search ........................ 357/65, 66, 67, 68, 357/69, 80, 81; 29/830; 174/254, 255, 256, 260, 259

[56] References Cited

U.S. PATENT DOCUMENTS

| | | | |
|---|---|---|---|
| 3,971,610 | 7/1976 | Buchoff et al. | 174/254 X |
| 4,442,966 | 4/1984 | Jourdain et al. | 228/123 |
| 4,764,804 | 8/1988 | Sahara et al. | 357/81 |
| 4,818,728 | 4/1989 | Rai et al. | 29/830 X |
| 4,922,321 | 5/1990 | Arai et al. | 357/68 |
| 5,068,714 | 11/1991 | Seipler | 357/80 |

FOREIGN PATENT DOCUMENTS

| | | |
|---|---|---|
| 0303256 | 6/1989 | European Pat. Off. |
| 82176738 | 7/1982 | Japan . |
| WO91/14014 | 4/1991 | PCT Int'l Appl. . |

OTHER PUBLICATIONS

Patent Abstracts of Japan, vol. 9, No. 110 (E-314) (1833) (1985).
Delfs, In: Moderne Aufbau-Und Verbindungstechniken in der Mikioelektronik Proceedings Seminar, Berlin (1983).
Kawanobe, et al., In: Proceedings: 31st IEEE Electronic Components Conference, Atlanta (1981).
Szczepanski, "Promising Techniques in On-Chip Assembly of Semiconducting Components and Monolithic Integrated Circuits", NASA 13-33 77A31551, Elektronika, 17(2): 57-61 (1977).
Doo, et al., IBM Technical Disclosure Bulletin (USA), 20(4): 1440 (1977).
Markstein, Electronic Packaging and Production, 27(10): 46 (1987).
Mandal, "Evaluation of Advanced Microelectronic Fluxless Solder-Bump Contacts for Hybrid Microcircuits," NASA Contractor Report NAS 8-31496 (1976).
Shumay, Advanced Materials and Processes, 130(5): 38 (1986).
Ginsberg, Electronic Packaging and Production, 25(9): 140 (1985).

Primary Examiner—Leo P. Picard
Assistant Examiner—Trinidad Korka
Attorney, Agent, or Firm—Hamilton, Brook, Smith & Reynolds

[57] ABSTRACT

A method is presented for interconnecting bond pads of a flip chip with bond pads of a substrate by an electrically conductive polymer. An organic protective layer is selectively formed over a surface of a flip chip to thereby leave exposed bond pads on the flip chip. Monomer is formed on the bond pads extending to a level beyond the organic protective layer to form bumps. The bumps are aligned with bond pads of a substrate and then contacted to those bond pads. The bumps can be polymerized either before or after contacting the bumps to the bond pads of the substrate to form electrically conductive interconnections between the bond pads of the flip chip and the bond pads of the substrate.

18 Claims, 2 Drawing Sheets

FLIP CHIP TECHNOLOGY USING ELECTRICALLY CONDUCTIVE POLYMERS AND DIELECTRICS

This application is a division of application Ser. No. 07/452,191, filed Dec. 18, 1989, now U.S. Pat. No. 5,074,947.

BACKGROUND OF THE INVENTION

Integrated circuits have had almost universal application to communication and military technologies for several years. Of increasing importance has been development of microcircuit wafers and methods for interconnection of the circuits by automated equipment. A primary limitation to application of microcircuit technology has been cost efficiency and reliability of interconnection of integrated circuits on chips because of the small size of the chips, which often require hundreds of connections to be made within each circuit.

One method of circuit interconnection is called flip chip bonding. Flip chip bonding can offer a shorter signal path and, therefore, more rapid communication between circuits than can other methods, such as tape automated bonding (TAB) or conventional wire bonding, because bond pads on flip chips are not restricted to the periphery of the chip, but rather are usually located at one face of the chip opposite a substrate. In one method of flip chip bonding, a chip or die is formed with the requisite integrated circuit and interconnect wiring required for interconnecting the circuit with other chip circuits on a circuit board, such as a separate printed circuit board or substrate. Bond pads are located at points of interconnection. Bumps are formed by plating of several layers of metals on the bond pads of the flip chip. Following deposition, the chip is heated to reflow the metals, thus causing surface tension of the deposit to form hemispherical solder "bumps." The flip chip is subsequently severed from the wafer of which it was a part and "flipped" for alignment with the bond pads of a substrate. These bumps are then contacted with the bond pads of the substrate and uniformly heated to simultaneously form interconnects between aligned bond pads of the flip chip and the substrate.

Use of metals to interconnect bond pads of flip chips and substrates has required, however, that passivation of the flip chip be accomplished by use of a metal barrier such as titanium (Ti), tungsten (W) or silicon nitride (Si$_3$N$_4$). Both the metal, as a passivation (or barrier) material, and ceramic, as a substrate material, are generally necessitated to allow sufficient heating to enable reflow of the solder bumps for interconnection between the flip chip and the substrate without consequential damage to either.

Fabrication of circuits using bumped flip chips have also been limited by the inability to visually inspect interconnections between the flip chip and the substrate. Further, the yield of finished mounted circuits can be detrimentally affected by failure of interconnects caused by the difference between the coefficients of thermal expansion of the various materials comprising the flip chip, the passivation layer, the solder bumps and the substrate. Also, melting of the solder bumps creates an electrically conductive flux as an undesirable by-product which generally must be removed from between the substrate and the flip chip to allow proper operation of the finished circuit.

Problems of heat stress during fabrication have been addressed by various methods, such as by rapid application of heat to a bumped flip chip and rapid conduction of heat from the solder interconnects in order to minimize damage to flip chips, substrates and interconnections due to internal stresses caused by thermal expansion and contraction. However, this method is very expensive.

Therefore, a need exists for a method of interconnecting flip chips to substrates which is fast, cost-effective and reliable, so that the advantages of flip chips over other types of microcircuit wafers can be exploited more fully. Also, there is a demand for a simplified method of connecting flip chips to substrates which eliminates the need for elaborate plating procedures. Further, a method which enables greater flexibility of passivation and choice of substrate is also desirable. These improvements could promote cost efficiency and broaden the applications for which microcircuits are suitable.

SUMMARY OF THE INVENTION

The present invention relates to a bumped flip chip technology and a method for interconnecting the bond pads of a bumped flip chip to the bond pads of a substrate. In accordance with the present invention, an organic protective layer is selectively formed over the surface of a flip chip, leaving the flip chip bond pads exposed. A monomer is formed at the bond pads of the flip chips to form "bumps" which extend beyond the organic protective layer. Alternatively, the monomer can be formed in two layers at each bond pad, the two layers together forming the bumps. The two layers can be polymerized to form an electrically conductive bump before connecting the bump with bond pads of the substrate. An adhesive is then applied to the substrate bond pads to provide "wet," or electrically conductive, connections between the bumps and substrate which are subsequently polymerized. An electrically conductive polymer is thereby selectively formed between the bond pads of the flip chip and the bond pads of the substrate. Alternatively, the monomer bumps can be polymerized after connecting the bumps of the flip chip to the bond pads of the substrate.

Electrical interconnections between bond pads of flip chips and bond pads of substrates are obtained by formation of a monomer at the bond pads of a flip chip. Polymerization of the monomer bumps can be achieved under milder thermal conditions than are required to reflow solder. Thus, reliability problems, caused by rapid heating and by large discrepancies of coefficients of thermal expansion of component materials in the flip chip, passivation layer, bumps and substrates, can be substantially reduced. Further, because the polymerization conditions are less harsh than required for reflow of solder bumps, the need for metal passivation of the flip chip is eliminated and a wider variety of substrate types is enabled. Also, complicated and time-consuming vapor deposition and electroplating techniques for depositing solder bumps are eliminated. In addition, polymer interconnects are fluxless, thus eliminating difficult problems with removal of electrically conductive flux between flip chips and substrates. The organic protective layer can also have a low dielectric constant, thereby acting as a passivation layer and enabling close proximity of the flip chip to the substrate and consequent shortened circuit paths in the finished circuit.

The above features and other details of the invention, either as steps of the invention or as combinations of parts of the invention, will now be more particularly described with reference to the accompanying drawings and pointed out in the claims. It will be understood that the particular embodiments of the invention are shown by way of illustration and not as a limitation of the invention. The principle feature of the invention may be employed in various embodiments without departing from the scope of the invention.

DETAILED DESCRIPTION OF THE DRAWINGS

DETAILED DESCRIPTION OF THE INVENTION

Figure 1:
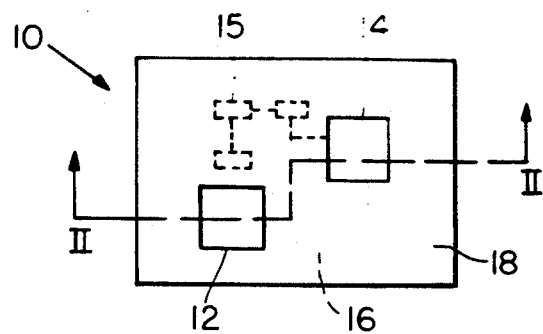
FIG. 1 is a plan view of one embodiment of the present invention after selective formation of an organic protective layer over the surface of a flip chip.
Figure 2:
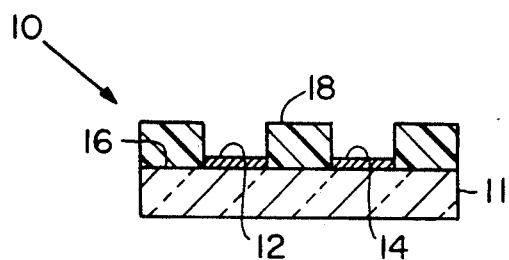
FIG. 2 is a section view of the embodiment of FIG. 1 taken along lines I—I.
Figure 3:
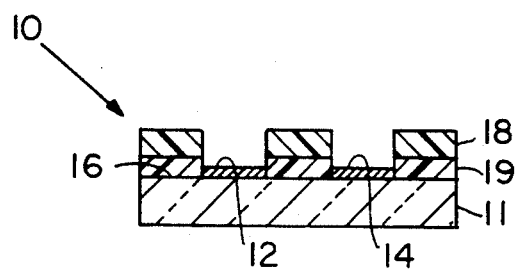
FIG. 3 is a section view of a flip chip which has been passivated with a silicon nitride or oxide layer, over which layer an organic protective layer has been formed.

In one embodiment of the present invention, shown in FIG. 1, a simplified illustrative version of a flip chip 10 is shown. It consists of bond pads 12,14 on upper planar surface 16 of flip chip die 11. Die 11 is formed of silicon, gallium arsenide, germanium or some other conventional semiconductor material. As can be seen in FIG. 2, an organic protective layer 18 is formed over circuits 15 (connected to the bond pads) and surface 16 of flip chip 10 by screen printing, stenciling, spin-etching or by other methods of monomer or polymer deposition. Alternatively, flip chip 10 also can be passivated with silicon nitride or an oxide layer 19 before formation of organic protective layer 18, as is shown in FIG. 3. The organic protective layer is preferably a dielectric polymer. An example of an organic material suitable for application in the present invention is Epo-Te ® polyimide, manufactured by Epoxy Technology, Inc. Bond pads 12,14 are covered during deposition of organic protective layer 18 and are then left exposed following deposition, as shown in FIG. 2. Organic protective layer 18 is preferably polymerized by application of heat or other conventional means prior to formation of monomer layers 20,22 on bond pads 12,14, shown in FIG. 4. Organic protective layer 18 passivates and thereby insulates and protects the underlying surface 16 of flip chip 10.

Figure 4:
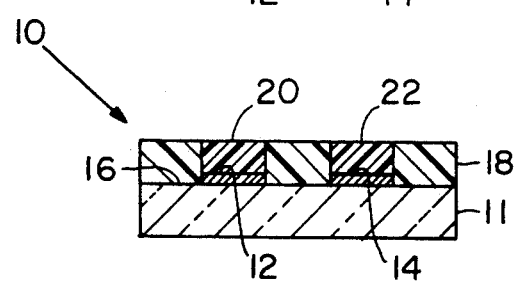
FIG. 4 is a section view of the embodiment of FIG. 1 after formation of the first layer of a monomer on the bond pads of the flip chip.
Figure 5:
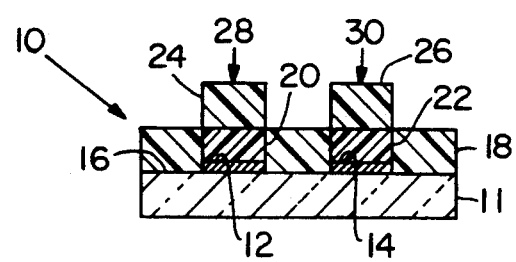
FIG. 5 is a section view of the embodiment of FIG. 1 after formation of a second layer of monomer on the first layer to thereby form bumps.
Figure 6:
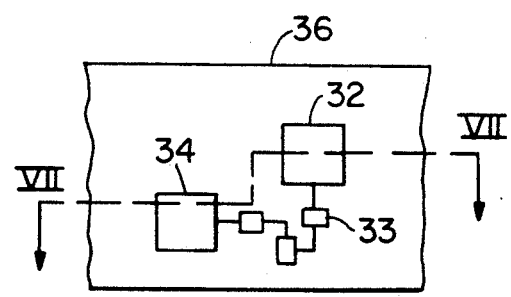
FIG. 6 is a plan view of a substrate suitable for use with the present invention.
Figure 7:
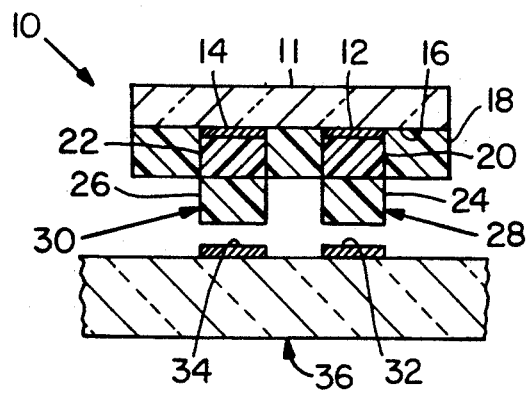
FIG. 7 is a section view of the embodiment of FIG. 1 and of the substrate taken along lines VI—VI of FIG. 6 after aligning the bumps of the flip chip with bond pads of the substrate.
Figure 8:
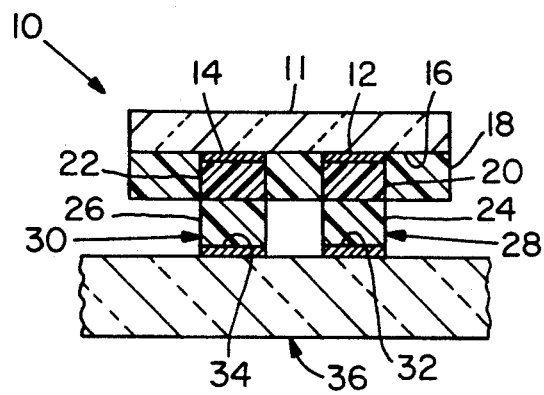
FIG. 8 is a section view of the embodiment of FIG. 1 after contact of the bumps of the flip chip to the bond pads of the substrate.

As shown in FIG. 4, first layers 20,22 of a monomer, are selectively formed on bond pads 12,14. Monomer, as that term is used herein, can include a thermoset polymer, a B-stage polymer, a thermoplastic polymer, or any monomer or polymer which, upon polymerization or upon further polymerization, is electrically conductive or which can support an electrically conductive material. The monomer can be gold-filled, silver-filled, or filled with some other electrically conductive material. The organic protective layer 18 acts as a template defining areas for deposition of first layers 20,22 of monomer on flip chip 10. In a preferred embodiment of the present invention, the unpolymerized organic protective layer has a high thixotropy for retaining a pattern on surface 16. The flip chip 10 can thus be manipulated more conveniently during subsequent formation of monomer onto bond pads 12,14. First layers 20,22 are substantially flush with polyimide layer 18. Second layers 24,26 of an monomer such as are used to form first layers 20,22, are formed on first layers 20,22, as shown in FIG. 5. First layers 20,22 and second layers 24,26 form bumps 28,30 on flip chip 10. As shown in FIG. 6, circuit 33 on substrate 36 is connected with bond pads 32,34. As can be seen in FIG. 7, bumps 28,30 are located on flip chip 10 in a position which is aligned with the known position of bond pads 32,34 on substrate 36. As shown in FIG. 8, bond pads 32,34 are then brought into contact with bumps 28,30. Bumps 28,30 are then polymerized by heating, or by other known methods, to form electrically conductive interconnections between flip chip bond pads 12,14 and substrate bond pads 32,34. Substrates which are suitable for use with the present invention include materials such as ceramic, silican, porcelain, conventional printed circuit board materials, or other conventional substrates suitable for electrical circuits.

If the monomer is a thermoset, the first layers 20,22 can be polymerized before formation of the second layers 24,26. Second layers 24,26 can be hemispherical in shape before contact is made with substrate bond pads 32, 34. First layers 20,22 and second layers 24,26 form bumps 28,30 which can be contacted to substrate bond pads 32,34 before polymerization. Bumps 28,30 are subsequently polymerized to form electrical interconnections between flip chip bond pads 12,14 and substrate bond pads 32,34. Alternatively, first layers 20,22 can be polymerized before deposition of second layers 24,26.

Figure 9:
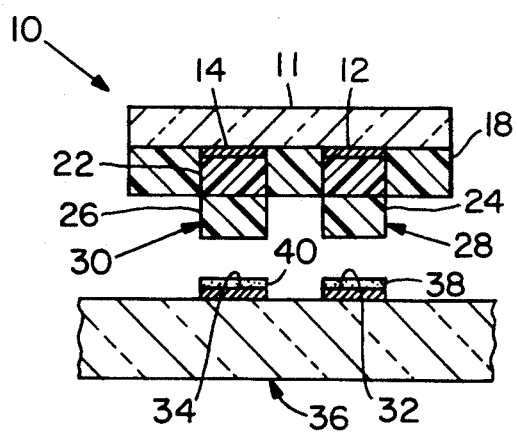
FIG. 9 is a section view of a third embodiment of the present invention wherein the monomer bumps have been polymerized to form an electrically conductive polymer and wherein an electrically conductive adhesive has been applied to the substrate bond pads prior to contacting the flip chip bumps to the bond pads of the substrate.
Figure 10:
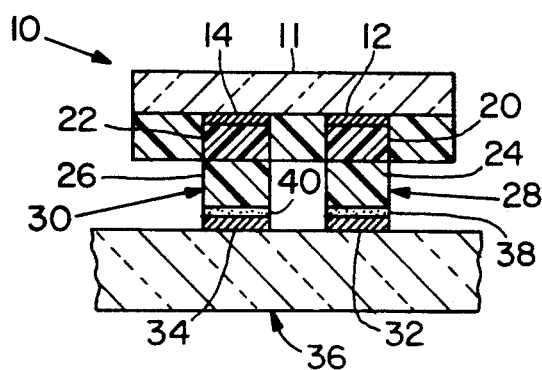
FIG. 10 is a section view of the embodiment of FIG. 9 after contacting the flip chip bumps to the bond pads of the substrate and polymerization of the adhesive to form electrical interconnections between the bond pads of the flip chip and the bond pads of the substrate.

In another embodiment of the present invention, shown in FIG. 9, bumps 28,30 can be formed as monomers and then polymerized before contact with substrate bond pads 32,34. As seen in FIG. 9, adhesive 38,40 is formed on substrate bond pads 32,24 before bumps 28,30 are contacted to substrate bond pads 32,34. Examples of adhesives which can be used include thermosets, thermoplastics and polymer thick film. Adhesive is formed on substrate bond pads by screen printing, stenciling, or by some other conventional method.

Bumps 28,30 are brought into contact with substrate bond pads 32,34, as shown in FIG. 11, and t he electrically conductive adhesive is then polymerized by heating or by other conventional means to form electrical interconnections between bond pads 12,14 of flip chip 10 and bond pads 32,34 of substrate 36.

The monomer used to form first layers 20,22 and second layers 24,26 of bumps 28,30 can be a B-stage polymer. Examples of suitable B-stage polymers include thermosets and thermoplastics. Solvents within the B-stage polymer can be substantially evaporated from the monomer comprising bumps 28,30 before bumps 28,30 are contacted to substrate bond pads 32,34. Evaporation of the solvent within the B-stage polymer causes the bumps 28,30 to retain a substantially rigid shape while the flip chip is manipulated for contacting bumps 28,30 to substrate 36. The B-stage polymer can subsequently be polymerized to form electrical interconnections between flip chip bond pads 12,14 and substrate bond pads 32,34.

In a preferred embodiment, flip chip 11 is aligned over substrate 36 by a flip chip aligner bonder, such as model M-8, manufactured by Research Devices, Division of the American Optical Corporation.

Equivalents

Although preferred embodiments have been specifically described and illustrated herein, it will be appreciated that many modifications and variations of the present invention are possible, in light of the above teachings, within the purview of the following claims, without departing from the spirit and scope of the invention. For example, while the discussion is directed to a single flip chip on a substrate which flip chip has only one circuit and two bond pads, it is to be understood that the concept can be readily expanded to include a plurality of chips with a plurality of circuits and bond pads on each.

We claim:

1. A bumped substrate, comprising:
   a) an electrical contact at a surface of the substrate;
   b) an organic protective coating disposed on the surface of the substrate and extending about the electrical contact; and
   c) a bump disposed at the electrical contact, the bump including at least two layers, each of said layers being formed of an electrically-conductive polymer or a monomer which, upon polymerization, forms a electrically-conductive polymer.

2. The bumped substrate of claim 1 wherein the substrate is a chip, and the electrical contact is a bond pad.

3. The bumped substrate of claim 1 wherein the substrate is a flip chip and the electrical contact is a bond pad.

4. The bumped substrate of claim 3 wherein a bump is raised from a surface of the original protective coating.

5. The bumped substrate of claim 4 wherein a first layer of said bump is disposed at the electrical contact of said substrate and is generally flush with a surface of the organic protective coating.

6. The bumped substrate of claim 5 wherein a second layer of said bump is disposed on the first layer and extends beyond the surface of the organic protective coating.

7. The bumped substrate of claim 6 wherein the organic protective layer is a polyimide.

8. The bumped substrate of claim 7 wherein at least one of the layers of the bump is formed of an electrically-conductive β-stage, thermoplastic or thermoset monomer or polymer.

9. The bumped substrate of claim 8 further comprising an electrically-conductive adhesive disposed at the bump.

10. The bumped substrate of claim 9, wherein the substrate is formed of a material selected from the group consisting essentially of Si, GaAs and Ge.

11. An electrical circuit, comprising:
    a) a first substrate which includes at least one electrical contact disposed at a surface of said first substrate;
    b) an organic protective coating disposed on the surface and extending about the electrical contact of the first substrate;
    c) a second substrate which includes at least one electrical contact disposed at a surface of said second substrate; and
    d) an interconnection disposed between an electrical contact of said first substrate and an electrical contact of said second substrate, the interconnection including at least two layers, each of said layers being formed of an electrically-conductive polymer or a monomer which, upon polymerization, forms an electrically-conductive polymer.

12. A bumped substrate, formed by a method, comprising the steps of:
    a) selectively forming an organic protective layer on a surface of the substrate, leaving an electrical contact of the first substrate exposed;
    b) disposed a first layer of an electrically-conductive polymer or monomer on the electrical contact of said substrate; and
    c) disposing a second layer of an electrically conductive polymer or monomer on said first layer, the first and second layers forming an electrically-conductive bump.

13. The bumped substrate of claim 12 wherein the substrate is a flip chip and the electrical contact is a bond pad.

14. The bumped substrate of claim 13 wherein the organic protective layer is a polyimide.

15. The bumped substrate of claim 14 wherein at least one of the layers of the electrically conductive bump is a β-stage polymer, a thermoplastic polymer, or thermoset polymer.

16. An article which includes an electrical interconnection between electrical contacts of first and second substrates, formed by a method comprising the steps of:
    a) selectively forming an organic protective layer over a surface of the first substrate, leaving an electrical contact on the first substrate exposed;
    b) disposing a first layer of an electrically-conductive polymer or monomer on the electrical contact of said first substrate;
    c) disposing a second layer of the electrically-conductive polymer or monomer on said first layer, the first and second layers together forming an electrically-conductive bump; and
    d) contacting the electrically-conductive bump with an electrical contact of the second substrate, thereby forming an electrical interconnection between the electrical contacts of the first and second substrates.

17. The article of claim 16 wherein the first substrate is a flip chip and the electrical contact is a bond pad.

18. The article of claim 17 wherein the organic protective layer is a polyimide.

* * * * *